United States Patent
Katsis et al.

(10) Patent No.: US 8,164,502 B2
(45) Date of Patent: Apr. 24, 2012

(54) DATA LOOK AHEAD TO REDUCE POWER CONSUMPTION

(75) Inventors: Dimitrios Katsis, Emeryville, CA (US); Barry Concklin, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 13/102,595

(22) Filed: May 6, 2011

(65) Prior Publication Data

US 2011/0205095 A1 Aug. 25, 2011

Related U.S. Application Data

(63) Continuation of application No. 12/607,924, filed on Oct. 28, 2009, now Pat. No. 7,961,130.

(60) Provisional application No. 61/230,956, filed on Aug. 3, 2009.

(51) Int. Cl.
 *H03M 1/66* (2006.01)
(52) U.S. Cl. .................................. 341/144; 341/136
(58) Field of Classification Search .................. 341/144, 341/136, 135, 133, 127, 145; 327/103, 416; 326/37
See application file for complete search history.

(56) References Cited

U.S. PATENT DOCUMENTS

| | | | |
|---|---|---|---|
| 6,489,905 B1 | 12/2002 | Lee et al. | |
| 6,507,296 B1 | 1/2003 | Lee et al. | |
| 6,646,580 B2 | 11/2003 | Clara et al. | |
| 6,917,316 B2 | 7/2005 | Blackburn | |
| 7,053,805 B2 | 5/2006 | Chang et al. | |
| 7,511,771 B2 | 3/2009 | Stern et al. | |
| 7,583,216 B2 * | 9/2009 | Felder et al. | 341/144 |
| 2009/0128784 A1 | 5/2009 | Yoon | |

* cited by examiner

*Primary Examiner* — Joseph Lauture
(74) *Attorney, Agent, or Firm* — Fliesler Meyer LLP

(57) ABSTRACT

Portions of a digital signal are buffered prior to being provided to a sub-system (e.g., a segmented DAC of a LDD) that is responsive to the digital signal. While being buffered, there is a determination, based on the buffered portions of the digital signal, of when one or more portions of the sub-system and/or another sub-system can be switched from a first state to a second state, where the second state results in less power dissipation than the first state. Additionally, or alternatively, while the portions of the digital signal are being buffered, there can be a determination, based on the buffered portions of the digital signal, of when one or more system related parameters can be adjusted to temporarily reduce power dissipation. Based on results of the determination(s), the state of one or more portions of the sub-system and/or another sub-system is/are selectively switched from the first state to the second state, or vice versa. Eventually, the portions of the digital signal are provided to the sub-system so that the sub-system can respond to the portions of the digital signal.

24 Claims, 5 Drawing Sheets

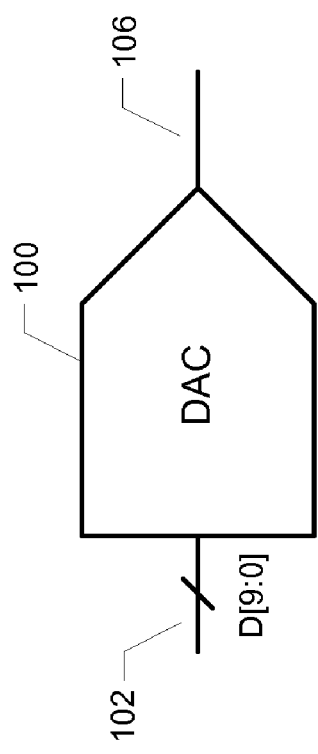
*FIG. 1
(PRIOR ART)*
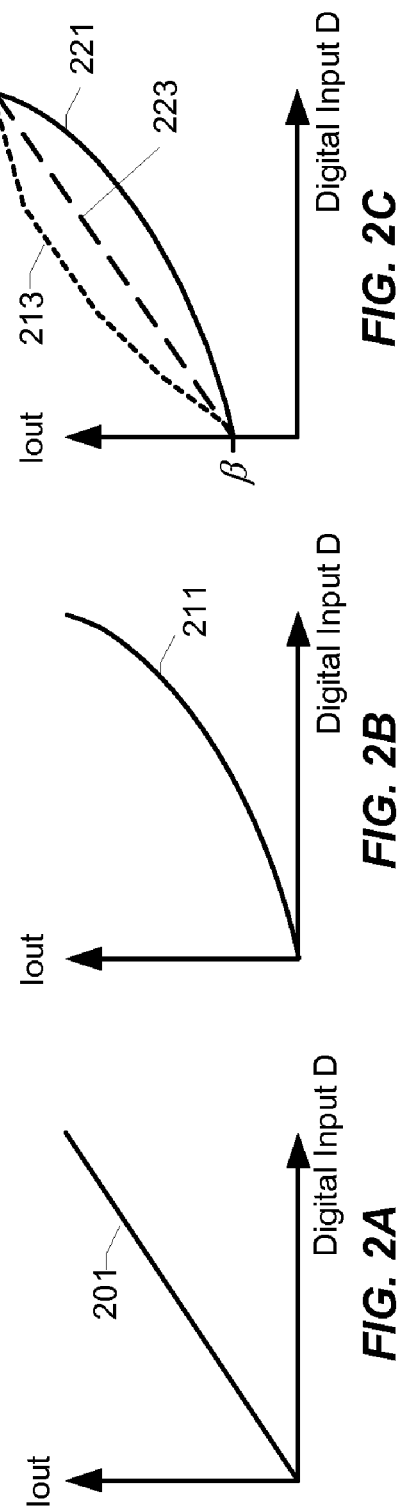
*FIG. 2A*
*FIG. 2B*
*FIG. 2C*

DATA LOOK AHEAD TO REDUCE POWER CONSUMPTION

PRIORITY CLAIM

This application is a continuation of U.S. patent application Ser. No. 12/607,924, entitled "Data Look Ahead to Reduce Power Consumption," filed Oct. 28, 2009, which claims priority under 35 U.S.C. 119(e) to U.S. Provisional Patent Application No. 61/230,956, entitled "Data Look Ahead to Reduce Power Consumption," filed Aug. 3, 2009, both of which are incorporated herein by reference.

RELATED APPLICATION

This application is related to commonly invented and commonly assigned U.S. patent application Ser. No. 12/607,929, entitled "Programmable Segmented Digital-to-Analog Converter (DAC)," filed Oct. 28, 2009, and which is incorporated herein by reference.

BACKGROUND

FIG. 1 illustrates an exemplary current digital-to-analog converter (DAC) 100 that accepts a multi-bit digital input signal 102, and outputs an analog current 106 indicative of the digital input signal 102. In FIG. 1 the DAC 100 is shown as receiving 10 bits, labeled D[9:0], where bit position 0 is the least significant bit (LSB) and bit position 9 is the most significant bit (MSB). Thus, the DAC 100 can be referred to as a 10-bit DAC, or equivalently as a DAC having 10-bits of resolution. While DAC 100 is shown as having 10 bits of resolution, more or less bits can be used, depending upon the desired resolution of the DAC.

FIGS. 2A and 2B illustrate exemplary transfer functions for a DAC, also referred to as DAC transfer functions. More specifically, FIG. 2A illustrates a linear DAC transfer function 201, and FIG. 2B illustrates a non-linear DAC transfer function 211. The non-linearity of the transfer function shown in FIG. 2B can be due to component and/or current mismatches as well as other non-idealities within the DAC, as will be appreciated from the discussion below.

The current DAC 100 (which will simply be referred to hereafter as "the DAC") can be implemented using multiple current sources, as is well known in the art. For example, the 10-bit DAC 100 can include (2^10)−1 (i.e., 1023) equally weighted current sources, which are selectively turned on and off based on the digital input D[9:0], such that 2^10 (i.e., 1024) different analog current levels can be produced at the output of the DAC. Alternatively, less current sources can be used where the current sources are appropriately differently weighted. For example, as few as 10 differently weighted current sources may be used, each of which is controlled by one of the 10 bits. Many variations of this are possible, as is well known in the art.

One type of DAC is known as a segmented DAC, because it essentially includes a plurality of sub-DACs that form the larger DAC. There are numerous ways to implement a segmented DAC, not all of which are described herein. Typically each sub-DAC will receive at least some of the bits of the digital data input (e.g., D[9:0]) and generate a current output in response to the digital input. The currents output by the plurality of sub-DACs are typically added to produce the output of the larger DAC. Each sub-DAC can receive a corresponding reference current Iref that is used by the sub-DAC to calibrate the internal current sources (within the sub-DAC) that are used to convert a digital input to an analog output. The various reference currents Iref can be automatically adjusted, e.g., using feedback and/or a master reference current, in an attempt to compensate for component and current mismatches between the sub-DACs, to attempt to cause the larger DAC to be substantially linear (e.g., so that transfer function of the larger DAC resembles line 201 in FIG. 2A).

Conventionally, a component within a segmented DAC (and with many other types of sub-systems) receive the same bias current regardless of whether that component is being used, e.g., to produce an output. Because such bias currents dissipate power (and thus can deplete a battery providing such power), components that are not being used still dissipate power, which is inefficient. This is especially a problem with battery powered portable devices, where there is a desire to minimize power consumption, to thereby maximize the time between battery re-charges or battery replacements.

SUMMARY

Specific embodiments of the present invention can be used to reduce power consumed by a sub-system, such as, but not limited to, a segmented digital-to-analog converter (DAC) of a laser diode driver (LDD). In accordance with an embodiment, portions of a digital signal are buffered prior to providing the portions of the digital signal to a sub-system (e.g., a segmented DAC of a LDD) that is responsive to the digital signal. While the portions of the digital signal are being buffered, there is a determination, based on the buffered portions of the digital signal, of when one or more portions of the sub-system and/or another sub-system can be switched from a first state to a second state, where the second state results in less power dissipation than the first state. Based on results of the determination, the state of one or more portions of the sub-system and/or another sub-system is/are selectively switched from the first state to the second state, or vice versa. Eventually, the portions of the digital signal are provided to the sub-system so that the sub-system can respond to the portions of the digital signal.

In accordance with an embodiment, the first state can be a first power mode (e.g., a normal power mode), and the second state can be a second power mode (e.g., a sleep mode) that results in less power dissipation than the first power mode. In accordance with another embodiment, the first state can be an activate state, and the second state can be a de-activated state. In accordance with an embodiment, during the first state a specific sub-system produces an output, and during the second the specific sub-system does not produce an output.

Additionally, or alternatively, while the portions of the digital signal are being buffered, there can be a determination, based on the buffered portions of the digital signal, of when one or more system related parameters can be adjusted to temporarily reduce power dissipation. Based on results of the determination, one or more of the system related parameters are selectively temporarily adjusted. Exemplary system related parameters that can be adjusted include, but are not limited, adjusting bias or reference currents, adjusting laser diode supply voltages, sending external signals to control/enable/disable other system components such as mirrors and light sensors, etc.

As mentioned above, the sub-system can be a segmented digital-to-analog converter (DAC), which includes a plurality of sub-DACs. Accordingly, portions of the digital signal can be buffered prior to providing the portions of the digital signal to the segmented DAC. While the portions of the digital signal are being buffered, there is a determination, based on the buffered portions of the digital signal, of when one or more sub-DACs of the segmented DAC can be switched from the first state to the second state. Based on results of the determination, the state of one or more sub-DACs of the segmented DAC can be selectively switched from the first state to the second state, or vice versa. Eventually, the portions of the digital signal are provided to the segmented DAC so that the segmented DAC can convert the portions of the digital signal to an analog signal.

In accordance with an embodiment of the present invention, a system (e.g., miniature projector) includes a sub-system (e.g., a segmented DAC of a LDD) that is responsive to a digital signal. Additionally, the system includes a multi-register pipeline configured to receive the digital signal and to store portions of the digital signal, prior to providing the portions of the digital signal to the subsystem. Further, the system includes control circuitry configured to determine, based on the portions of the digital signal stored in the multi-register pipeline, when one or more portions of the sub-system and/or another sub-system can be switched from a first state to a second state, where the second state results in less power dissipation than the first state. Such control circuitry is also configured to selectively switch the state of one or more portions of the sub-system and/or another sub-system, when it is determined that one or more portions of the sub-system and/or another sub-system can be switched from the first state to the second state, or vice versa. Such a system can be, e.g., a miniature projector, or a sub-system (e.g., an LDD) of a miniature projector, but is not limited thereto.

This summary is not intended to summarize all of the embodiments of the present invention. Further and alternative embodiments, and the features, aspects, and advantages of the embodiments of invention will become more apparent from the detailed description set forth below, the drawings and the claims.

BRIEF DESCRIPTION OF THE DRAWINGS

FIG. 1 is a high level representation of a current digital-to-analog converter (DAC) 100.

FIG. 2A illustrates an exemplary linear DAC transfer function.

FIG. 2B illustrates an exemplary nonlinear DAC transfer function.

FIG. 2C is used to illustrate a technique to compensate for the non-linearity of a load and/or system, to effectively achieve a substantially linear combined transfer function.

DETAILED DESCRIPTION

Figure 3:
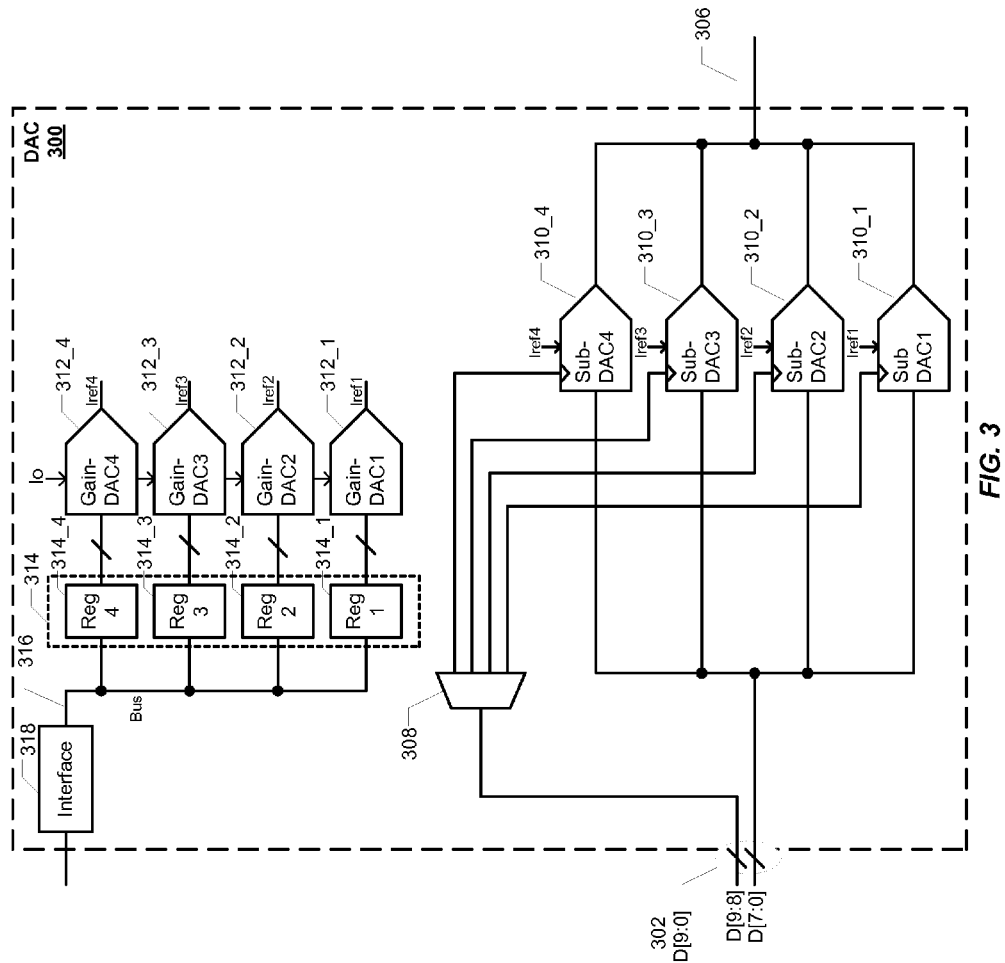
FIG. 3 is a high level diagram of a segmented current DAC according to an embodiment of the present invention.

FIG. 3 illustrates a segmented DAC 300, according to an embodiment of the present invention. While the segmented DAC 300 is shown as including four sub-DACs 310_1, 310_2, 310_3 and 310_4, more or less sub-DACs can be used. The sub-DACs may also be referred to as output sub-DACs, since they are being used to generate an analog output 306 of the larger DAC 300, in response to a digital input 302.

Still referring to FIG. 3, the DAC 300 also includes a decoder 308, which can be a thermometer decoder, but is not limited thereto. In accordance with an embodiment, the decoder 308 receives the log 2 (N sub-DACs) MSBs of the digital input signal 302. Thus, because in this example there are four sub-DACs, the decoder 308 receives the two MSBs D[9:8] of signal 302 (because the log 2(4)=2). The remaining bits D[7:0] are provided to the inputs of each of the four sub-DACs 310.

In FIG. 3, the decoder 308 decodes the two MSBs D[9:8] to determine which sub-DACs should be fully on, partially on, or fully off. As the terms are used herein: a fully on sub-DAC produces a current at its output by switching to the output (of the sub-DAC) all of the current sources within the sub-DAC; a partially on sub-DAC produces a current at its output by switching to the output (of the sub-DAC) only some of the current sources within the sub-DAC; and a fully off sub-DAC produces no current at the output (of the sub-DAC) by not switching any of its current sources to the output of the sub-DAC. In the embodiment shown, the most significant sub-DAC 310 selected by the decoder 308 is at least partially on (but can potentially be fully on, depending on D[7:0]). All of the less significant sub-DACs (if any) will be fully on, and all of the more significant sub-DACs (if any) will be fully off.

As mentioned above, all of the sub-DACs 310 receive the bits not provided to the decoder 308. Thus, in FIG. 3, all of the sub-DACs receive the eight LSBs D[7:0]. The fully on sub-DAC(s) will essentially ignore the eight LSBs, because all the current sources within a fully on sub-DAC will be switched to the output of the sub-DAC regardless of the values of the eight LSBs. The fully off sub-DAC(s) will also essentially ignore the eight LSBs, because all the current sources within a fully off sub-DAC will not be switched to the output of the sub-DAC regardless of the values of the eight LSBs. However, the most significant sub-DAC turned on, which can be partially on (or fully on), uses the eight LSBs D[7:0] to determine which current sources within the sub-DAC should be selectively switched to the output of the sub-DAC.

As also shown in FIG. 3, each of the sub-DACs 310_1, 310_2, 310_3 and 310_4 receives a corresponding reference current Irefx, labeled Iref1, Iref2, Iref3 and Iref4, respectively. In an embodiment, each reference current is programmable or otherwise controllable, so that the DAC transfer function of DAC 300 can be controlled by separately controlling the transfer function of each sub-DAC 310.

In an embodiment, as shown in FIG. 3, each of the reference currents is generated using a corresponding gain-DAC 312 that receives a digital value from one or more corresponding register(s) 314, or portions thereof. For simplicity, it will be assumed that each gain-DAC 312 receives a digital value from a corresponding gain control register 314_1, 314_2, 314_3 and 314_4, collectively referred to as gain control registers 314. The gain control registers 314 are shown as being connected to a bus 316, which is connected to an interface 318, that enables the programming of the registers 314. The interface 318 can be, e.g., a serial to parallel interface or a parallel to parallel interface, but is not limited thereto.

Assuming that Irefx is produced at the output of a gain-DAC 314_x (also referred to as gain_DACx), and that each gain-DAC receives substantially the same reference current Io, then an exemplary transfer function of each gain-DACx can be Irefx=(reg_value_x)*Io. Io can be produced, e.g., using a single current source, and multiple versions of Io can be replicated using one or more current mirrors. Assuming that the transfer function of a partially on sub-DACx is Ioutx=Irefx*Dx, where Dx is the digital input to the sub-DACx (e.g., Dx can be D[7:0]), then the transfer function of a partially on sub_DACx can be rewritten as Ioutx=(reg_value_x)*Io*(the actual digital input to the sub-DACx). The transfer function of a fully on sub_DACx could similarly be expressed as Ioutx=(reg_value_x)*Io*(the maximum digital input to the sub-DACx), since all the current sources within a fully on sub-DAC will be switched to the output of the sub-DAC regardless of the digital input to the sub-DAC. The transfer function of a fully off sub_DACx could simply be Ioutx=0, since all the current sources within a fully off sub-DAC will not be switched to the output of the sub-DAC regardless of the digital input to the sub-DAC.

To add an offset β to the above transfer function, an additional offset sub-DAC (not shown) can be added, which receives an offset value (reg_value_β) input from an offset register. Such a register can be programmed, e.g., via the bus 316 and interface 318. Such an offset sub-DAC can be within the DAC 300, or external the DAC 300. Where such an offset sub-DAC is used to provide a threshold current to a laser diode, the offset sub-DAC may be referred to as a threshold-DAC.

In the above described manner, a desired piecewise linear DAC can be achieved, where each sub-DAC (e.g., 310) has a substantially linear transfer function, but the larger DAC (e.g., 300) can have a desired non-linear (but continuous) transfer function. As can be appreciated from FIG. 2C, the DAC 300 can be used to purposefully produce a nonlinear transfer function (e.g., resembling line 213) through adjustments of the reference currents to thereby achieve the inverse of another transfer function (e.g., resembling line 221), to effectively achieve a linear system transfer function (e.g., resembling line 223). The appropriate reference currents can be achieved in various ways, only some of which are mentioned herein. For non-time varying linearities, the reference currents provided to the sub-DACs can be determined empirically, e.g., using lab experiments, and digital values defining the reference currents can be loaded into the DAC (e.g., into the gain control registers 314) after a factory calibration. For relatively slow time varying nonlinearities (e.g., due to aging of a laser diode), reference currents (and more specifically the digital values used to define the same) can be adjusted through a feedback loop, e.g., during a foreground start up calibration. For relatively fast time varying nonlinearities (e.g., due to changes in temperature of a laser diode), reference currents (and more specifically the digital values used to define the same) can be adjusted through a real time calibration (foreground or background).

The DAC 300, and similar programmable DACs, can be used in various applications, e.g., in hand-held and other miniature projectors (that are often referred to as picoprojectors). The capability to externally modify a DAC transfer function, which was described above, can be used to counteract known nonlinearities of a load (e.g., laser diode) being driven using the DAC, as well as other system nonlinearities. Additionally, the capability to automatically calibrate a DAC transfer function can be used to compensate for potentially time varying nonlinearities. Further, as will be described below, embodiments of the present invention can also be used to enable power savings.

In FIG. 3, the DAC 300 can be thought of as being divided into four segments, where each segment includes a sub-DAC 310, a corresponding gain-DAC 312 and a corresponding portion of the gain control registers 314 that specifies the value provided to the gain-DAC. While the DAC 300 was shown to including four segments, other numbers of segments can be used. For example, in a specific embodiment, the DAC 300 includes sixteen segments (and thus, sixteen sub-DACs and sixteen gain-DACs).

Splitting a DAC (e.g., 300) into multiple (N) segments to create the piecewise linear functionality effectively splits the power intensive support circuitry required to drive the DAC into N segments driving each of the sub-DACs. Since each sub-DAC presents ~1/N of the total DAC load, its supporting circuitry is ~1/N of that required to drive the total DAC. Splitting the support circuits into N segments enables selective reducing to a lower power mode (e.g., disabling) of certain segments (or portions thereof) not being used, thereby providing better power efficiency than conventional schemes. For example, when one or more sub-DACs and gain-DACs are not being used to produce the current that is being output by the larger DAC 300 (and are not going to be used for at least a specified time) the bias current(s) provided to such components can be reduced to a lower level. This will be described in more detail below.

While each gain-DAC 312 is described as being a current DAC, in alternative embodiments each gain-DAC can be a voltage DAC that produces a reference voltage output that is converted to a reference current, e.g., using a transconductance circuit.

In further embodiments, the function of the registers 314 and gain-DACs 312 can be replaced with analog circuitry that provides a separately controlled reference current for each of the sub-DACs. For example, refreshable and controllable sample-and-holds or analog memory cells (e.g., analog non-volatile memory (ANVM) cells), or the like, and corresponding transconductance circuitry can be used to provide a separately controlled reference current for each of the sub-DACs.

As will now be explained with reference to FIG. 4, in accordance with specific embodiments of the present invention, a multi-register pipeline 421 is used in combination with the segmented DAC 300 (or some other segmented DAC or other sub-system), to determine when one or more portions of the segmented DAC (or other sub-system) can be switched from a first state to a second state, e.g., from a normal power mode to a reduced power mode that consumes less power. In an embodiment, the first state is an activate state, and the second state is a de-activated state. In an embodiment, the first state is an output generating state, and the second state does not generate an output. These are just a few examples, which are not meant to be all encompassing.

Figure 4:
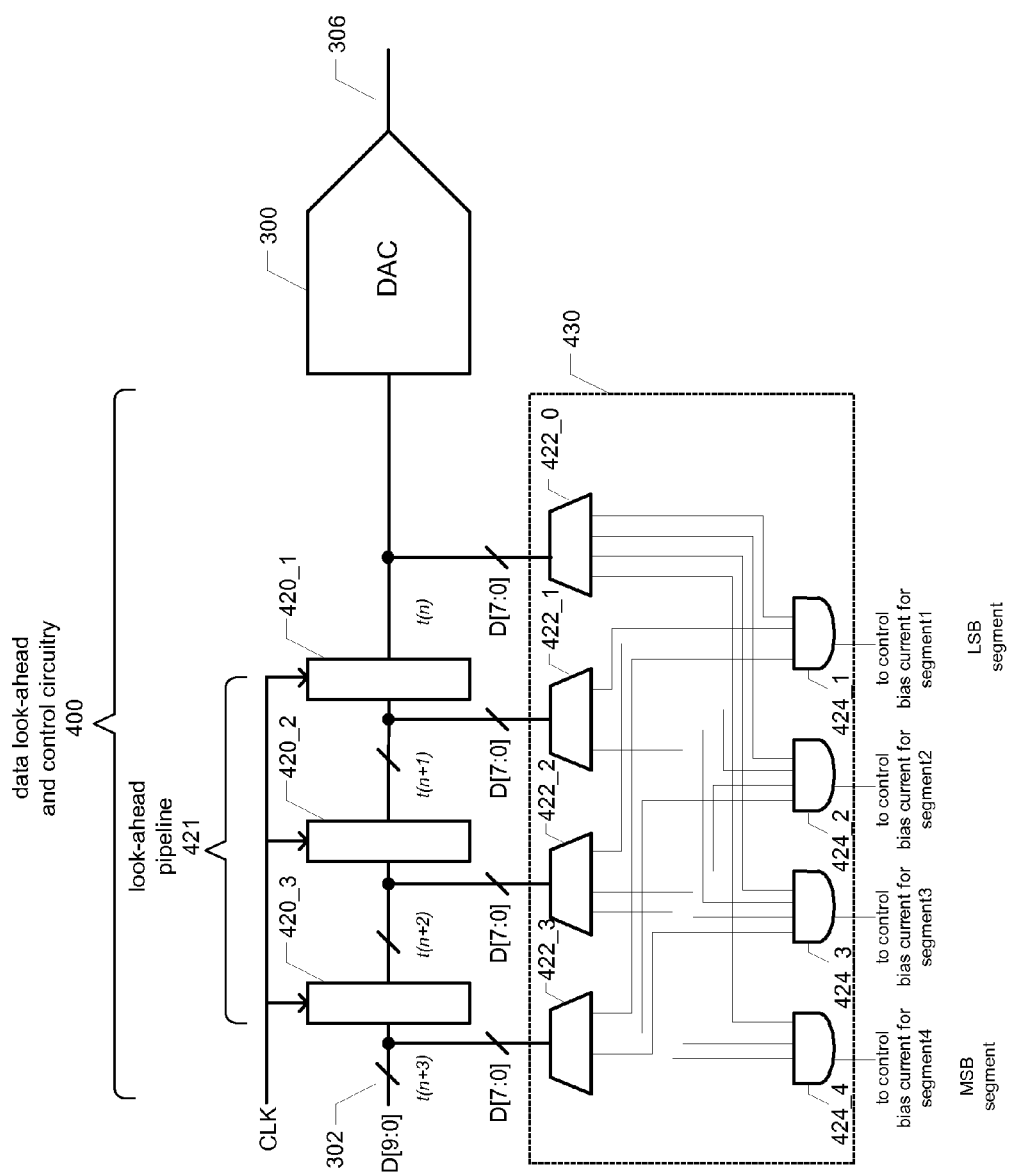
FIG. 4 illustrates how a look-ahead pipeline and a controller can be used to reduce power consumed by the segmented DAC of FIG. 3, as well as other sub-systems, in accordance with embodiments of the present invention.

Referring to FIG. 4, the multi-register pipeline 421 (also referred to as a look-ahead pipeline) is shown as including three multi-bit registers 420_1, 420_2 and 420_3 (but could include more or less registers) connected such that the output of one register is provided to the input of the next register (where there is a next register). Each register 420 receives a clock signal, which causes a shifting of the data in the registers each clock period. As can be appreciated from FIG. 4, the multi-register pipeline 421 receives the digital signal 302 (e.g., D[9:0]) and stores portions of the digital signal at a time, prior to providing the portions of the digital signal to the segmented DAC 300 (or other sub-system).

Also shown in FIG. 4 is control circuitry 430 that determines, based on the portions of the digital signal stored in the multi-register pipeline 421, when one or more sub-DACs 310 (or other portions) of the segmented DAC 300 (or other sub-system) can be switched from a first (e.g., normal) power mode to a reduced power mode that consumes less power than the normal power mode. Additionally, the control circuitry 430 can control the selective switching of the power mode of one or more sub-DACs 310 (or other portions) of the segmented DAC 300 (or other sub-system), from the normal power mode to the reduced power mode, and vice versa. The multi-register pipeline 421 and the control circuitry 430 can be collectively referred to as data look-ahead and control circuitry 400. While a specific implementation of the data look-ahead and control circuitry 400 is shown in FIG. 4, one of ordinary skill in the art after reading this description would realize that various alternative implementations are possible and are within the scope of the present invention.

For an example, the control circuitry 430 can be used to switch a sub-DAC (e.g., sub-DAC 310_4) to a reduced power mode when it is determined that the sub-DAC will not be used to produce the current output of the segmented DAC 300 for at least a specified amount of clock cycles (e.g., at least three clock cycles). The control circuitry 430 can thereafter switch the sub-DAC back to the normal power mode when it is determined that sub-DAC is going to be used to produce the current output of the segmented DAC 300 within a specified amount of clock cycles (e.g., within the next three clock cycles).

FIG. 4 illustrates one way to implement the control circuitry 430, according to an embodiment of the present invention. In FIG. 4, the control circuitry includes four decoders 422_0, 422_1, 422_2 and 422_4, and four AND gates 424_1, 424_2, 424_3 and 424_4. The decoder 422_0 decodes the data presently being provided to the digital input of the segmented DAC 300 at time t(n); the decoder 422_1 decodes the data the will be provided to the digital input of the segmented DAC 300 after 1 clock cycle at time t(n+1); the decoder 422_2 decodes the data the will be provided to the digital input of the segmented DAC 300 after 2 clock cycles at time t(n+2); and the decoder 422_3 decodes the data the will be provided to the digital input of the segmented DAC 300 after 3 clock cycles at time t(n+3). In this manner, the decoder 422_0 can determine which sub-DACs (if any) at time t(n) produce current at their output; the decoder 422_1 can determine which sub-DACs (if any) at time t(n+1) produce current at their output; the decoder 422_2 can determine which sub-DACs (if any) at time t(n+2) produce current at their output; and the decoder 422_3 can determine which sub-DACs (if any) at time t(n+3) produce current at their output. In an embodiment, the output of each of the decoders 422 can be one of the following five thermometer codes:

| | |
|---|---|
| 1111 | no sub-DACs 310_1, 320_2, 310_3 and 310_4 produce current at their output; |
| 1110 | sub-DAC 310_1 produces current at its output, and sub-DACs 310_2, 310_3 and 310_4 do not produce current at their outputs; |
| 1100 | sub-DACs 310_1 and 310_2 produce current at their outputs, and sub-DACs 310_3 and 310_4 do not produce current at their outputs; |
| 1000 | sub-DACs 310_1, 310_2 and 310_3 produce current at their outputs, and sub- 310_4 does not produce current at its output; and |
| 0000 | all sub-DACs 310_1, 310_2, 310_3 and 310_4 produce current at their outputs. |

In the configuration of FIG. 4, there is an AND gate 424 for each sub-DAC 310, and the output of each AND gate 424 will be HIGH whenever the sub-DAC 310 (corresponding to the AND gate 424) isn't producing a current at its output at time t(n) and will not produce a current at its output for at least the next three clock cycles (i.e., at times t(n+1), t(n+2) and t(n+3)), and thus will not be used to produce the current output of the segmented DAC 300 during those times. In this manner the outputs of the AND gates 424, and more generally of the control circuitry 430, can be used to selectively switch the power mode of the various segments of the segmented DAC 300 (or another sub-system) from a first power mode to a reduced power mode, and vice versa. In other words, the control circuitry 430 determines that one or more sub-DACs (and corresponding gain DACs) can be switched from the first power mode to the reduced power mode when, based on the portions of the digital signal stored in the multi-register pipeline, the control circuitry determines that the one or more sub-DACs are not being used by the segmented DAC 300 to convert the digital signal 302 to the 306 analog signal.

The 3-register length of the pipeline 421 was selected, using the assumption that once a sub-DAC is switched to low power mode, it will take at 3 clock cycles after the sub-DAC is switched back to normal power mode for the sub-DAC to acceptably settle and be used to accurately produce a current at its output. If this time is longer, the length of the pipeline 421 should be increased. If this time is shorter, the length of the pipeline 421 could be decreased.

The normal power mode can involve providing one or more components with a normal bias current, and the low power mode can involve providing the component(s) with a reduced bias current. Conventionally, components within a segmented DAC or other type of sub-system receive the same bias current regardless of whether the components are being used, e.g., to produce an output. For example, referring back to FIG. 3, each sub-DAC 310 can receive the same bias current and each gain-DAC 312 can receive the same bias current regardless of whether the sub-DAC and gain-DAC are being used to produce the current that is being output by the larger DAC 300. Because such bias currents dissipate power (and thus can deplete a battery providing such power), components that are not being used still dissipate power, as mentioned above.

In accordance with embodiments of the present invention, bias currents can be selectively reduced to a lower level, and returned to the normal level when appropriate. For example, when one or more sub-DACs and gain-DACs are not being used to produce the current that is being output by the larger DAC 300 (and are not going to be used for at least a specified time) the bias current(s) provided to such components can be reduced to a lower level. While the lower level can be a zero level, that may not always be desirable, depending upon the time it takes a component to settle after the bias current level is returned to the normal level.

Embodiments of the present invention can be used to reduce the power consumption of other types of segmented DACs, and thus should not be limited to use with the segmented DAC 300 described with reference to FIG. 3. Further, embodiments of the present invention can be used to reduce the power and/or otherwise control the states of other types of sub-systems besides DACs, so long as portions of such sub-systems can be selectively put into a reduced power mode due to such portions not being used (or not requiring normal power) for periods of time that can be determined based on the data being input to the subsystem.

Figure 5:
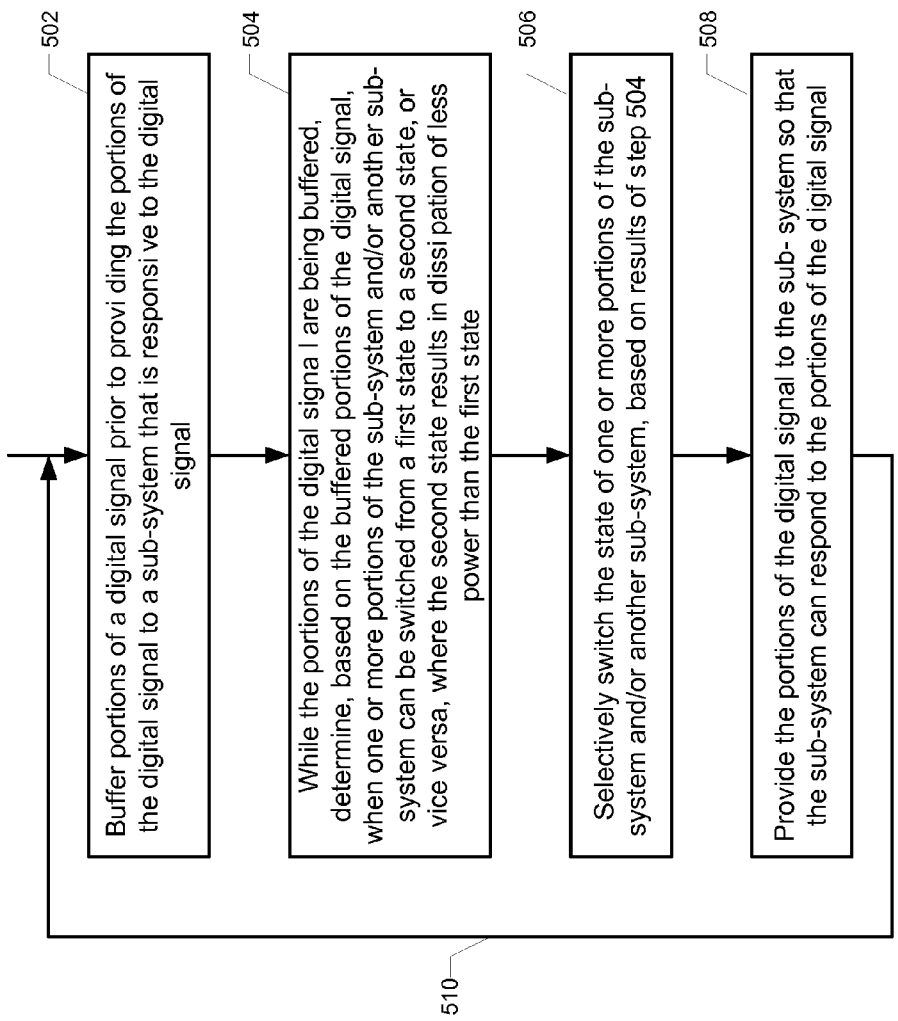
FIG. 5 is a high level flow diagram that summarizes techniques for reducing power consumption, in accordance with embodiments of the present invention.

FIG. 5 is a high level diagram that is used to summarize specific embodiments of the present invention that can be used to reduce power consumed by a sub-system, such as, but not limited to, a segmented DAC.

Referring to FIG. 5, as indicated at step 502, portions of a digital signal are buffered prior to providing the portions of the digital signal to a sub-system (e.g., a segmented DAC) that is responsive to the digital signal. As shown in FIG. 4, a multi-register pipeline (e.g., 421) can be used to perform such buffering.

As indicated at step 504, while the portions of the digital signal are being buffered, there is a determination, based on the buffered portions of the digital signal, of when one or more portions of the sub-system (e.g., sub-DACs and gain DACs) and/or another sub-system (e.g., a threshold DAC) can be switched from a first state to a second state, where the second state results in less power dissipation than the first state. In an embodiment, the first state is a first power mode and the second state is a second power mode that results in less power dissipation than the first power mode. For example, the first power mode can be a normal power mode, and the second power mode can be a sleep mode or other reduced power modes. More than two states can be used. For example, in addition to the sleep mode there can also be a deep sleep power mode, which can be used when it is determined from the buffered data that a specific portion of a sub-system is not going to be used for at least an extended period of time (e.g., M clock cycles). In an embodiment, the first state is an activate state, and the second state is a de-activated state. In an embodiment, the first state is an output generating state, and the second state does not generate an output. These are just a few examples, which are not meant to be all encompassing.

At step 504, there can be a determination that a sub-system (e.g., one or more of the sub-DACs and gain DACs) can be switched from a first state to a second state, if it is determined that one or more specific sub-systems are not going to be used to produce an output for at least a specified amount of time (e.g., at least 3 clock cycles), thereby, e.g., enabling the sub-system(s) that are not going to be being used (to produce the output) to be switched to a lower power state to thereby conserve power. This is just one example.

As indicated at step 506, the state of one or more portions of the sub-system and/or another sub-system are selectively switched from the first state to the second state, and/or vice versa, based on results of step 504 prior to providing the portions of the digital signal being buffered at step 502 to the sub-system that is responsive to the digital signal. As shown in FIG. 4, the control circuitry 430 can perform steps 504 and 506. Alternative control circuitry can be used while being within the scope of the present invention.

Further, as indicated by step 508, the aforementioned portions of the digital signal are eventually provided to the sub-system so that the sub-system can respond to the portions of the digital signal (e.g., so a segmented DAC can convert a digital signal to an analog signal).

Steps 502, 504, 506 and 508 are repeated for further portions of the digital signal, as indicated by line 510. As these steps are repeated, steps 504 and 506 also include determining when a sub-system (e.g., one or more of the sub-DACs and gain DACs) should be switched from the second state (e.g., a power saving mode) back to the first state, e.g., if it is determined that one or more specific sub-systems (not previously being used to produce an output) are going to be used to produce an output within a specified amount of time (e.g., within the next 3 clock cycles), thereby, e.g., enabling the sub-system(s) that are going to be being used to be ready for such use.

Where video and audio signals are separate (e.g., as with movies), a delay circuit can be added in an audio signal path to provide a delay that is similar to the latency added by the look-ahead pipeline in the video path, to assist in synchronization of the video and audio signals. Additional and/or alternative techniques to provide such synchronization may also be used. It is also possible, depending on the length of the pipeline, that the latency added in the video path is so small that such synchronization does not need to be performed.

In accordance with an embodiment, the length of the look-ahead pipeline can be programmable. This can enable the length of the pipeline to be optimized for a specific use of the pipeline. Alternatively, the length of the pipeline can be fixed, but the portion/depth of the pipeline being analyzed for a sub-system can be programmable.

Where the state of more than one sub-system is being controlled based on the contents of the same look-ahead pipeline, various different depths of the same pipeline can be analyzed for different sub-systems. For example, assume that a look-ahead pipeline has a length of 10-registers. Also assume that it will take 3 clock cycles after a first sub-system is switched back from a low power mode to a normal power mode for the first sub-system to acceptably settle, but it will take 7 clock cycles after a second sub-system is switched back from a low power mode to a normal power mode for the second sub-system to acceptably settle. For the first sub-system, 3 registers of the 10 register pipeline may be analyzed to determine when the first system can be selectively switched to a low power mode, while at the same time for the second sub-system, 7 registers of the register pipeline may be analyzed to determine when the second system can be selectively switched to a low power mode.

The sub-system that has its state changed (e.g., is put into a reduced power mode) based on analysis of the pipeline data may be different from the sub-system that is fed with the data that moves through the pipeline. Further, there are also other actions (apart from reducing the power) that can be accomplished by analyzing the pipeline data. For example, a sub-system (e.g. a DAC of constant current, referred to as threshold DAC) can be de-activated when the data within the next N (e.g., 3) clock cycles will be zero. In this case the data going to DAC 300 can be buffered using the look ahead pipeline in order to activate or de-activate the output and/or the bias current of a separate DAC (e.g., a threshold DAC). These are just a few examples, which are not meant to be all encompassing.

Large sections of the output DACs of laser diode drivers (LDDs) of a miniature projector often consume large amounts of steady state power regardless of the input data (i.e., even though not all sections require the steady state power), since they are too slow to be turned on and off according to the input code. By using the features described above, the input data is buffered through a multiple stage pipeline, thus enabling a look ahead at the input data. Such look ahead enables sections of the LDDs to be selectively put into a reduced power mode or some other lower power state, as well as allowing optimization of other system parameters according to buffered input data.

In a LDD chip of a miniature projector, input data is fed in digital form into the chip. By looking ahead at the input data stream, embodiments of the present invention can be used optimize the power and performance of the projector LDD without having to rely on fast settling analog circuits. Typically, portions of the input data are used to generate an output within a few cycles of them being applied at the input. In the accordance with specific embodiments of the present invention, a pipeline of registers at the input creates a queue of input data, thus introducing latency from the input to the output. By increasing the number of registers this latency can be arbitrarily increased in a well controlled fashion, thus giving the system enough time to optimize the performance according to the incoming data. This optimization includes (but is not limited to) reducing power (e.g., powering off) sections of a segmented output DAC, adjusting bias or reference currents for optimal performance, adjusting laser diode supply voltages, sending external signals to control/enable/disable other system components such as MEMS mirrors and light sensors, etc. These are just a few examples of how the looking ahead at data, in accordance with embodiments of the present invention, can be used to improve overall system performance and power efficiency. However, embodiments of the present invention should not be limited to only those examples described above.

Figure 6:
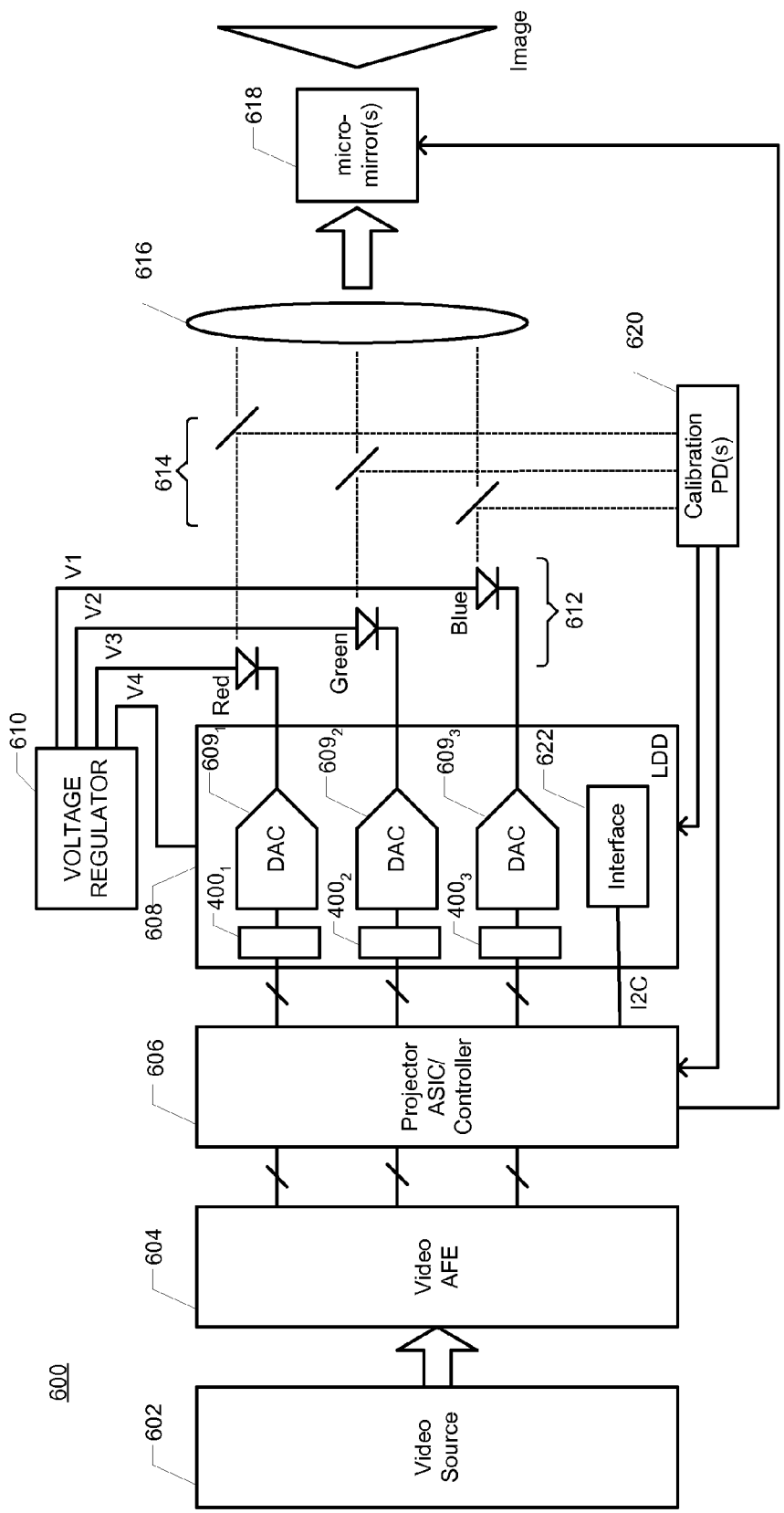
FIG. 6 is a high level diagram of a miniature projector system according to an embodiment of the present invention.

FIG. 6 illustrates an exemplary miniature projector display device 600, according to an embodiment of the present invention, which includes a plurality of DACs 609, one or more of which can be implemented as a programmable segmented DAC 300, described above. The miniature projector device 600 can be integrated with or attached to a portable device, such as, but not limited to, a mobile phone, a smart phone, a portable computer (e.g., a laptop or netbook), a personal data assistant (PDA), or a portable media player (e.g., DVD player). The miniature projector device 600 can alternatively be integrated with or attached to a non-portable device, such as a desktop computer or a media player (e.g., a DVD player), but not limited thereto.

Referring to FIG. 6, the projector display device 600 is shown as including a video source 602, a video analog front end (AFE) 604, a controller 606 (which can be an application specific integrated circuit and/or a micro-controller), a laser diode driver (LDD) 608 and a voltage regulator 610. The video AFE 604 can include, e.g., one or more analog-to-digital converters (ADCs), and may not be needed where the video source is a digital video source. The controller 606 can perform scaling and/or pre-distortion of video signals before such signals are provided to the LDD 608. The voltage regulator 610 (e.g., a quad-output adjustable DC-DC buck-boost regulator) can convert a voltage provided by a voltage source (e.g., a battery or AC supply) into the various voltage levels (e.g., four voltage levels V1, V2, V3 and V4) for powering the various components of the projector display device 600.

The LDD 608 is shown as including three DACs 609 and a data interface 622, which can be, e.g., an Inter-Integrated Circuit (I2C) interface, but is not limited thereto. The LDD 608 also includes registers, and the like, which are not shown. One or more of the DACs 609 can be implemented as a programmable segmented DAC 300 of an embodiment of the present invention, as mentioned above. The DACs 609 of the LDD 608 drive laser diodes 612, which can include, e.g., a red, a green and a blue laser diode, but are not limited thereto. The use of alternative light emitting elements, such as light emitting diodes (LEDs), etc., is also possible. The light produced by the laser diodes 612 or other light emitting elements can be provided to beam splitters 614, which can direct a small percentage of the light toward one or more calibration photo-detectors (PDs) 620, and direct the remainder of the light toward projector optics 616, which include lenses, mirrors, reflection plates and/or the like. The light output by the optics 616 can be provided to one or more micro mirror(s) 618. The mirror(s) 618 can be controlled by the controller 606, or another portion of the system, to raster-scan reflected light onto a surface, e.g., a screen, a wall, the back of a chair, etc.

As shown in FIG. 6, separate data look-ahead and control circuitry 400 (labeled $400_1$, $400_2$ and $400_3$) is included in the LDD prior to the input of each DAC 609. Alternatively, the data look-ahead and control circuitry 400 can be located within each DAC 609, between the controller 606 and the LDD 608, or within the controller 606. Such data look-ahead and control circuitry 400 can be used to activate or de-activate the output and/or the bias current of a separate DAC (e.g., a threshold DAC). Such data look-ahead and control circuitry 400 can also be used to selectively put into a reduced power mode or some other lower power state sections of the LDD 608, as well as to optimize other system parameters in dependence on buffered input data being provided to the LDD 608. Details of how this can be done have been provided above.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A method for use with a system that includes at least one sub-system that is responsive to a digital signal, the method comprising:
   (a) buffering portions of the digital signal prior to providing the portions of the digital signal to the at least one sub-system that is responsive to the digital signal;
   (b) while the portions of the digital signal are being buffered,
       (b.1) determining, based on a first amount of the buffered portions of the digital signal, when a first portion of the system can be switched from a first state to a second state, where the second state results in less power dissipation than the first state, and
       (b.2) determining, based on a second amount of the buffered portions of the digital signal, when a second portion of the system can be switched from the first state to the second state, wherein the second amount is different than the first amount;
   (c) selectively switching the first portion of the system from the first state to the second state based on results of the determining performed at step (b.1), and selectively switching the second portion of the system from the first state to the second state based on results of the determining performed at step (b.2); and
   (d) providing the portions of the digital signal to the at least one sub-system that is responsive to the digital signal.

2. The method of claim 1, wherein the first and second portions of the system can be:
   different sub-systems of the system;
   different portions of different sub-systems of the system;
   same portions of different sub-systems of the system; or
   different portions of a same sub-system of the system.

3. The method of claim 1, wherein:
   step (b) also includes (b.3) determining, based on a third amount of the buffered portions of the digital signal, when a third portion of the system can be switched from the first state to the second state, and
   step (c) also includes selectively switching the third portion of the system from the first state to the second state based on results of the determining performed at step (b.3).

4. The method of claim 1, wherein:
   step (a) comprises using a multi-register pipeline including X registers to buffer portions of the digital signal prior to providing the portions of the digital signal to the at least one sub-system that is responsive to the digital signal;
   step (b.1) comprises determining, based on portions of the digital signal stored in Y of the X registers in the multi-register pipeline, when the first portion of the system can be switched from the first state to the second state; and
   step (b.2) comprises determining, based on portions of the digital signal stored in Z of the X registers in the multi-register pipeline, when the second portion of the system can be switched from the first state to the second state;
   wherein X, Y and Z are integers, and wherein at least one of Y and Z is less than X, and wherein Y and Z are different than one another.

5. The method of claim 1, wherein steps (a), (b), (c) and (d) are repeated for further portions of the digital signal.

6. The method of claim 1, wherein step (b) also includes:
determining when the first portion of the system should be switched from the second state to the first state; and
determining when the second portion of the system should be switched from the second state to the first state.

7. The method of claim 1, wherein:
the first state comprises a first power mode; and
the second state comprises a second power mode that results in less power dissipation than the first power mode.

8. The method of claim 7, wherein:
the first power mode comprises a normal power mode; and
the second power mode comprises a low power mode.

9. The method of claim 8, wherein the low power mode comprises a sleep mode.

10. The method of claim 1, wherein:
the first state comprises an activated state; and
the second state comprises a de-activated state.

11. A method for use with a system that includes at least one sub-system that is responsive to a digital signal, the method comprising:
(a) buffering portions of the digital signal prior to providing the portions of the digital signal to the at least one sub-system that is responsive to the digital signal;
(b) while the portions of the digital signal are being buffered,
(b.1) determining, based on a first amount of the buffered portions of the digital signal, when a first parameter associated with the system can be adjusted to temporarily reduce power dissipation and/or improve performance of the system;
(b.2) determining, based on a second amount of the buffered portions of the digital signal, when a second parameter associated with the system can be adjusted to temporarily reduce power dissipation and/or improve performance of the system, wherein the second amount is different than the first amount;
(c) selectively temporarily adjusting the first parameter associated with the system based on results of step (b.1), and selectively temporarily adjusting the second parameter associated with the system based on results of step (b.2); and
(d) providing the portions of the digital signal to the at least one sub-system that is responsive to the digital signal.

12. The method of claim 11, wherein the first and second parameters can be:
different parameters associated with different sub-systems of the system;
a same parameter associated with different sub-systems of the system; or
different parameters associated with a same sub-system of the system.

13. The method of claim 11, wherein each of the first and second parameters, which can be adjusted to temporarily reduce power dissipation and/or improve performance of the system, is selected from the group consisting of:
a bias current provided to a sub-system of the system;
a reference current provided to a sub-system of the system;
a supply voltage provided to a sub-system of the system; and
a control signal that controls, enables and/or disables a sub-system of the system.

14. The method of claim 11, wherein:
step (b) also includes (b.3) determining, based on a third amount of the buffered portions of the digital signal, when a third parameter associated with the system can be adjusted to temporarily reduce power dissipation and/or improve performance of the system, wherein the second amount is different than the first amount;
step (c) also includes selectively temporarily adjusting the third parameter associated with the system based on results of step (b.3).

15. The method of claim 11, wherein:
step (a) comprises using a multi-register pipeline including X registers to buffer portions of the digital signal prior to providing the portions of the digital signal to the at least one sub-system that is responsive to the digital signal;
step (b.1) comprises determining, based on portions of the digital signal stored in Y of the X registers in the multi-register pipeline, when the first parameter associated with the system can be adjusted to temporarily reduce power dissipation and/or improve performance of the system; and
step (b.2) comprises determining, based on portions of the digital signal stored in Z of the X registers in the multi-register pipeline, when the second parameter associated with the system can be adjusted to temporarily reduce power dissipation and/or improve performance of the system;
wherein X, Y and Z are integers, and wherein at least one of Y and Z is less than X, and wherein Y and Z are different than one another.

16. A system, comprising:
a plurality of sub-systems at least one of which is responsive to a digital signal;
a multi-register pipeline including X registers, wherein the multi-register pipeline is configured to receive the digital signal and to store portions of the digital signal prior to providing the portions of the digital signal to the at least one sub-system that is responsive to the digital signal; and
control circuitry configured to
determine, based on portions of the digital signal stored in Y of the X registers in the multi-register pipeline, when a first portion of the system can be switched from a first state to a second state, where the second state results in less power dissipation than the first state; and
determine, based on portions of the digital signal stored in Z of the X registers in the multi-register pipeline, when a second portion of the system can be switched from the first state to the second state;
wherein X, Y and Z are integers, and wherein at least one of Y and Z is less than X, and wherein Y and Z are different than one another.

17. The system of claim 16, wherein the control circuitry is also configured to:
selectively switch the first portion of the system from the first state to the second state, when it is determined that the first portion of the system can be switched from the first state to the second state; and
selectively switch the second portion of the system from the first state to the second state, when it is determined that the second portion of the system can be switched from the first state to the second state.

18. The system of claim 17, wherein the control circuitry is also configured to:
determine, based on portions of the digital signal stored in Y of the X registers in the multi-register pipeline, when the first portion of the system should be switched from the second state to the first state;
selectively switch the first portion of the system from the second state to the first state, when it is determined that the first portion of the system should be switched from the second state to the first state;

determine, based on portions of the digital signal stored in Z of the X registers in the multi-register pipeline, when the second portion of the system should be switched from the second state to the first state; and selectively switch the second portion of the system from the second state to the first state, when it is determined that the second portion of the system should be switched from the second state to the first state.

19. The system of claim 16, wherein:

the system includes a segmented DAC; and the first and second portions of the system, that can be switched from the first state to the second state, comprise sub-DACs of the segmented DAC.

20. The system of claim 16, wherein the first and second portions of the system can be:

different sub-systems of the system;

same portions of different sub-systems of the system;

different portions of different sub-system of the system; or different portions of a same sub-system of the system.

21. A system, comprising:

a plurality of sub-systems at least one of which is responsive to a digital signal;

a multi-register pipeline including X registers, wherein the multi-register pipeline is configured to receive the digital signal and to store portions of the digital signal prior to providing the portions of the digital signal to the at least one sub-system that is responsive to the digital signal; and control circuitry configured to determine, based on a first amount of the buffered portions of the digital signal stored in Y of the X registers in the multi-register pipeline, when a first parameter associated with the system can be adjusted to temporarily reduce power dissipation and/or improve performance of the system; and determine, based on a second amount of the buffered portions of the digital signal stored in Z of the X registers in the multi-register pipeline, when a second parameter associated with the system can be adjusted to temporarily reduce power dissipation and/or improve performance of the system, wherein the second amount is different than the first amount;

wherein X, Y and Z are integers, and wherein at least one of Y and Z is less than X, and wherein Y and Z are different than one another.

22. The system of claim 21, wherein the control circuitry is also configured to:

selectively temporarily adjust the first parameter associated with the system, when it is determined that the first parameter associated with the system can be adjusted to temporarily reduce power dissipation and/or improve performance of the system; and selectively temporarily adjust the second parameter associated with the system, when it is determined that the second parameter associated with the system can be adjusted to temporarily reduce power dissipation and/or improve performance of the system.

23. The system of claim 21, wherein the first and second parameters can be:

different parameters associated with different sub-systems of the system;

a same parameter associated with different sub-systems of the system; or different parameters associated with a same sub-system of the system.

24. The system of claim 21, wherein each of the first and second parameters, which can be adjusted to temporarily reduce power dissipation and/or improve performance of the system, is selected from the group consisting of:

a bias current provided to a sub-system of the system;

a reference current provided to a sub-system of the system;

a supply voltage provided to a sub-system of the system; and a control signal that controls, enables and/or disables a sub-system of the system.

* * * * *